(12) United States Patent
Schmidt et al.

(10) Patent No.: US 9,075,114 B2
(45) Date of Patent: Jul. 7, 2015

(54) USB CONNECTED MRT RECEIVER COIL WITH LOCAL DATA STORAGE AND A/D CONVERSION AT THE LOCAL COIL

(75) Inventors: Sebastian Schmidt, Weisendorf (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 733 days.

(21) Appl. No.: 13/151,264

(22) Filed: Jun. 1, 2011

(65) Prior Publication Data
US 2012/0139538 A1 Jun. 7, 2012

(30) Foreign Application Priority Data
Jun. 2, 2010 (DE) .......................... 10 2010 022 522

(51) Int. Cl.
*G01R 33/341* (2006.01)
*G01R 33/34* (2006.01)
*G01R 33/36* (2006.01)

(52) U.S. Cl.
CPC ........ *G01R 33/34046* (2013.01); *G01R 33/341* (2013.01); *G01R 33/34069* (2013.01); *G01R 33/3621* (2013.01)

(58) Field of Classification Search
CPC ............ G01R 33/341; G01R 33/3415; G01R 33/3621; G01R 33/3692; G01R 33/54; G01R 33/34046
USPC .......................... 324/300–322; 600/407–435; 382/128–131
See application file for complete search history.

(56) References Cited

U.S. PATENT DOCUMENTS

| 5,384,536 | A | 1/1995 | Murakami et al. ............ 324/309 |
| 6,834,201 | B2 * | 12/2004 | Gillies et al. .................. 600/411 |
| 7,027,808 | B2 * | 4/2006 | Wesby ............................ 455/419 |
| 7,834,628 | B2 * | 11/2010 | Biber et al. .................... 324/318 |
| 8,073,526 | B2 * | 12/2011 | Graham et al. ................ 600/411 |
| 2002/0103430 | A1 * | 8/2002 | Hastings et al. ............... 600/411 |
| 2003/0191386 | A1 | 10/2003 | Heid .............................. 600/410 |
| 2003/0195412 | A1 * | 10/2003 | Gillies et al. .................. 600/411 |
| 2005/0037807 | A1 * | 2/2005 | Dove .......................... 455/556.1 |
| 2005/0119556 | A1 * | 6/2005 | Gillies et al. .................. 600/410 |

(Continued)

FOREIGN PATENT DOCUMENTS

| CN | 1449720 A | 10/2003 |
| CN | 1534305 A | 10/2004 |

(Continued)

OTHER PUBLICATIONS

German Office Action dated Feb. 21, 2011 for corresponding German Patent Application No. De 10 2010 022 522.3-54 with English translation.

(Continued)

*Primary Examiner* — Melissa Koval
*Assistant Examiner* — Tiffany Fetzner
(74) *Attorney, Agent, or Firm* — Lempia Summerfield Katz LLC

(57) ABSTRACT

The present embodiments relate to a method and a local coil arrangement for a magnetic resonance tomography system. The local coil arrangement includes an antenna element for the reception of signals from an object under examination. The local coil arrangement also includes an A/D converter for the conversion of analog signals received with the antenna element into digitized signals, and a memory configured for the storage of the digitized signals.

25 Claims, 2 Drawing Sheets

(56) References Cited

U.S. PATENT DOCUMENTS

| | | | |
|---|---|---|---|
| 2005/0127914 A1 | 6/2005 | Eberler et al. | 324/318 |
| 2005/0222933 A1* | 10/2005 | Wesby | 705/36 |
| 2008/0200796 A1* | 8/2008 | Graham et al. | 600/411 |
| 2008/0291855 A1* | 11/2008 | Bata et al. | 370/311 |
| 2008/0295599 A1* | 12/2008 | Clasen et al. | 73/599 |
| 2010/0057655 A1* | 3/2010 | Jacobson et al. | 706/45 |
| 2010/0259261 A1* | 10/2010 | Saes et al. | 324/309 |
| 2011/0188552 A1* | 8/2011 | Yoon et al. | 375/219 |
| 2012/0139538 A1* | 6/2012 | Schmidt et al. | 324/309 |
| 2013/0201316 A1* | 8/2013 | Binder et al. | 348/77 |
| 2013/0225908 A1* | 8/2013 | Jacobson et al. | 600/13 |

FOREIGN PATENT DOCUMENTS

| | | |
|---|---|---|
| DE | 103 14 215 B4 | 11/2006 |
| WO | WO 2008/155703 A1 | 12/2008 |

OTHER PUBLICATIONS

Chinese Office Action dated Apr. 3, 2014 for corresponding Chinese Patent Application No. 201110147215.2 with English translation.

* cited by examiner

USB CONNECTED MRT RECEIVER COIL WITH LOCAL DATA STORAGE AND A/D CONVERSION AT THE LOCAL COIL

This application claims the benefit of DE 10 2010 022 522.3, filed Jun. 2, 2010.

BACKGROUND

The present embodiments relate to a coil arrangement and a method for a magnetic resonance tomography system.

Magnetic resonance devices for the examination of patients using magnetic resonance tomography are known, for example, from DE10314215B4.

In MR tomography, images with a high signal-to-noise ratio may be recorded with local coils (e.g., loops or local coils). Excited atomic nuclei of an object under examination (e.g., a patient) induce a voltage by radiation emitted by the excited atomic nuclei in a local coil receiving the radiation. The induced voltage is amplified with a low noise preamplifier and forwarded to receiver electronics in a wired manner at the MR frequency.

SUMMARY

The present embodiments may obviate one or more of the drawbacks or limitations in the related art. For example, the creation of MRT scans with a local coil may be optimized.

DETAILED DESCRIPTION OF THE DRAWINGS

Figure 2:
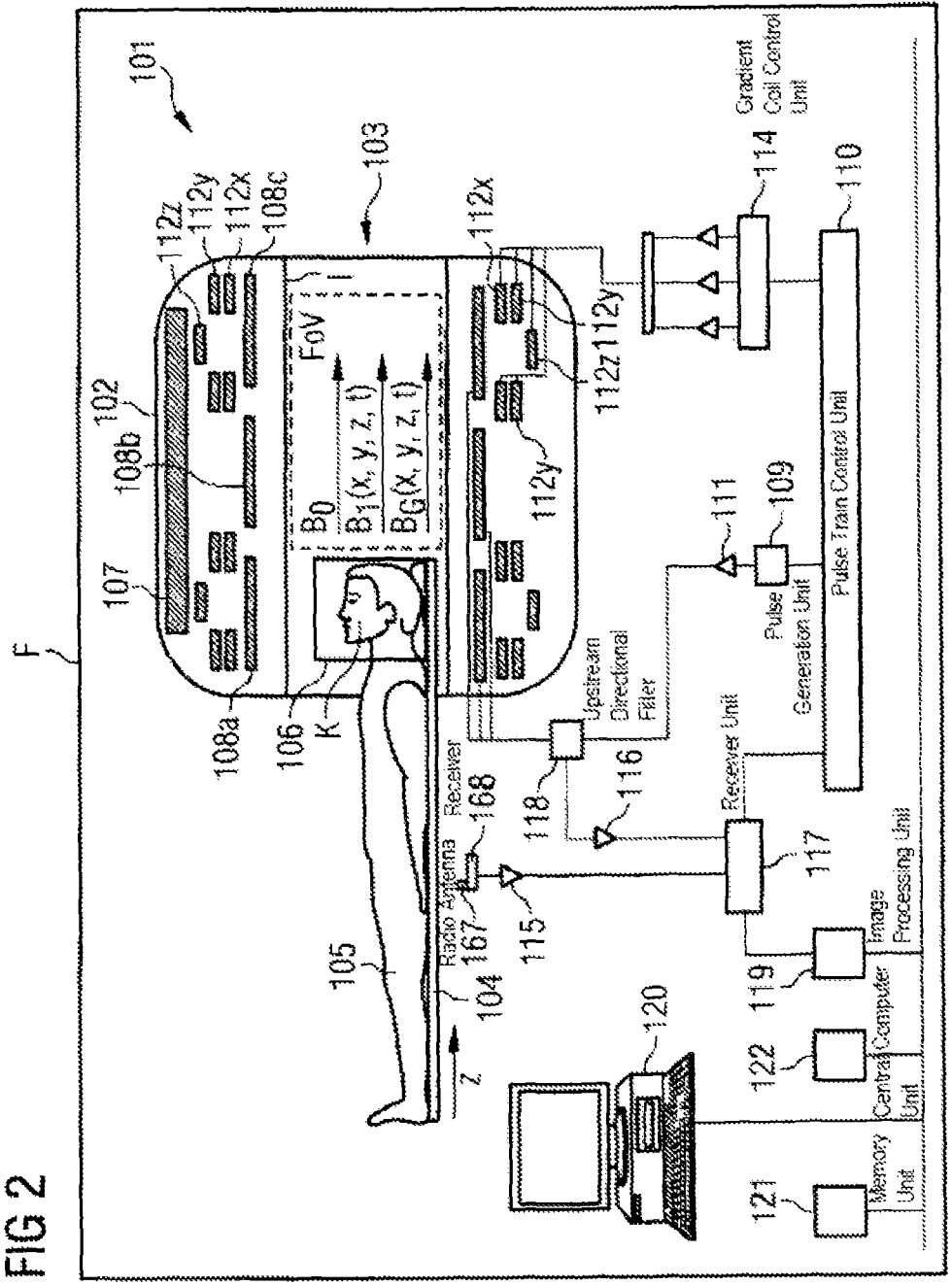
FIG. 2 shows an MRT system.

FIG. 2 shows an imaging magnetic resonance tomography device MRT 101 (e.g., arranged in a Faraday cage F or a room insulated against magnetic fields) with a whole body coil 102 with a tube-like space 103 (e.g., a tunnel-like opening), in which a patient couch 104 with a body, for example, of an object under examination 105 (e.g., a patient with or without local coil arrangement 106) may be conveyed in the direction of the arrow z in order to generate scans of the patient 105. The local coil arrangement 106 is laid on the patient. Scans may be made in a local area (e.g., a field of view FoV) with the local coil arrangement 106. Signals from the local coil arrangement 106 may be analyzed by an analysis device (e.g., elements 167, 166, 115, 117) of the MRT 101, which may, for example, be connected to the local coil arrangement 106 via a coaxial cable or by radio (AN; 167) (e.g., converted into images and stored or displayed).

In order to examine the object under examination 105 (e.g., a dummy or the patient) with a magnetic resonance device MRT 101 using magnetic resonance tomography imaging, different magnetic fields, precisely harmonized or synchronized with each other in temporal and spatial characteristics, are beamed at or generated in the object under examination 105. A powerful magnet (e.g., a cryomagnet 107) in a measuring cabin with the tunnel-like opening 103 generates a static powerful main magnetic field $B_0$ that, for example, amounts to 0.2 Tesla to 3 Tesla or even more. The object to be examined 105 positioned on the patient couch 104 is transported into an essentially homogenous area of the main magnetic field B0 in the field of view FoV. An excitation of the nuclear spin of atomic nuclei of the object to be examined 105 takes place via magnetic high frequency excitation pulses $B1(x, y, z, t)$ that are beamed in via a high frequency antenna (and/or if appropriate, a local coil arrangement), which is represented in FIG. 2 in simplified form as a body coil 108 (e.g., a multipart body coil 108a, 108b, 108c). High frequency excitation pulses are, for example, generated by a pulse generation unit 109, which is controlled by a pulse train controller unit 110. After an amplification by a high frequency amplifier 111, amplified high frequency excitation pulses are conveyed to the high frequency antenna 108. The high frequency system shown in FIG. 2 is indicated only in schematic form. In other embodiments, more than one pulse generation unit 109, more than one high frequency amplifier 111 and a plurality of high frequency antennae 108a, b, c are employed in the magnetic resonance device MRT 101.

The magnetic resonance tomography device 101 also includes gradient coils $112x$, $112y$, $112z$, with which in the case of a measurement, magnetic gradient fields are generated in for selective layer excitation and for spatial coding of the measurement signal. The gradient coils $112x$, $112y$, $112z$ are controlled by a gradient coil controller unit 114, which is in connection with the pulse train controller unit 110 in the same way as the pulse generation unit 109.

The MRT signals S emitted by the excited nuclear spin are detected by the body coil 108 and/or at least one local coil arrangement 106, amplified by assigned high frequency preamplifiers 116 on the local coil arrangement 106 and/or in the MRT and further processed and digitized by a receiver unit 117. The recorded measurement data is digitized and stored as complex numerical values in a k-space matrix. An associated MR image may be reconstructed from the k-space matrix populated with values using a multidimensional Fourier transformation.

In the case of a coil that may be operated both in the transmit and in the receive mode (e.g., the body coil 108 and/or the local coil 106), the correct signal transduction is regulated by an upstream directional filter 118.

An image processing unit 119 generates an image from the measurement data. The image is displayed for a user via an operating console 120 and/or stored in a memory unit 121. A central computer unit 122 controls the individual system components.

In MR tomography, images with a high signal-to-noise ratio (SNR) are recorded with local coil arrangements. The local coil arrangements are antennae systems that are attached in the direct vicinity of (anterior), under (posterior) or in the body. In the case of an MR measurement, the excited nuclei in the individual antennae induce a voltage in the local coil, which is amplified with a low noise preamplifier (e.g., LNA, Preamp) and forwarded to the receiver electronics. To improve the signal-to-noise ratio, high-field systems are also used in the case of high resolution images (e.g., 1.5 T and more). As more individual antennae may be connected to an MR receiver system than there are receivers, a switching matrix (e.g., RCCS) is built in between receiver antennae and receiver. This routes the currently active receiver channels (e.g., receiver channels that lie in the field of view of the magnet) to the available receiver. More coil elements may be connected than there are receivers present. For example, in the case of whole body coverage, those coils that are located in the FoV or in the homogeneity volumes of the magnet are read.

An antenna system may be designated as the local coil arrangement 106, which may, for example, include one or a plurality of antenna elements SP1, SP2, SP3 (e.g., coil elements) as an array coil, for example. The plurality of antenna elements is, for example, configured as loop antennae (loops), butterfly coils or saddle coils. The local coil arrangement includes, for example, coil elements, a preamplifier, further electronics (e.g., baluns), a housing, supports and a cable with a plug, using which the local coil arrangement is connected to the MRT system. A receiver 168 attached on the system side filters and digitizes a signal received from the local coil arrangement 106, for example, by radio, and transfers the data to a digital signal processing device 119 that may derive an image or a spectrum from the data obtained by a measurement. The digital signal processing device 119 may make the image available to the user, for example, for subsequent diagnosis by the user and/or storage.

Figure 1:
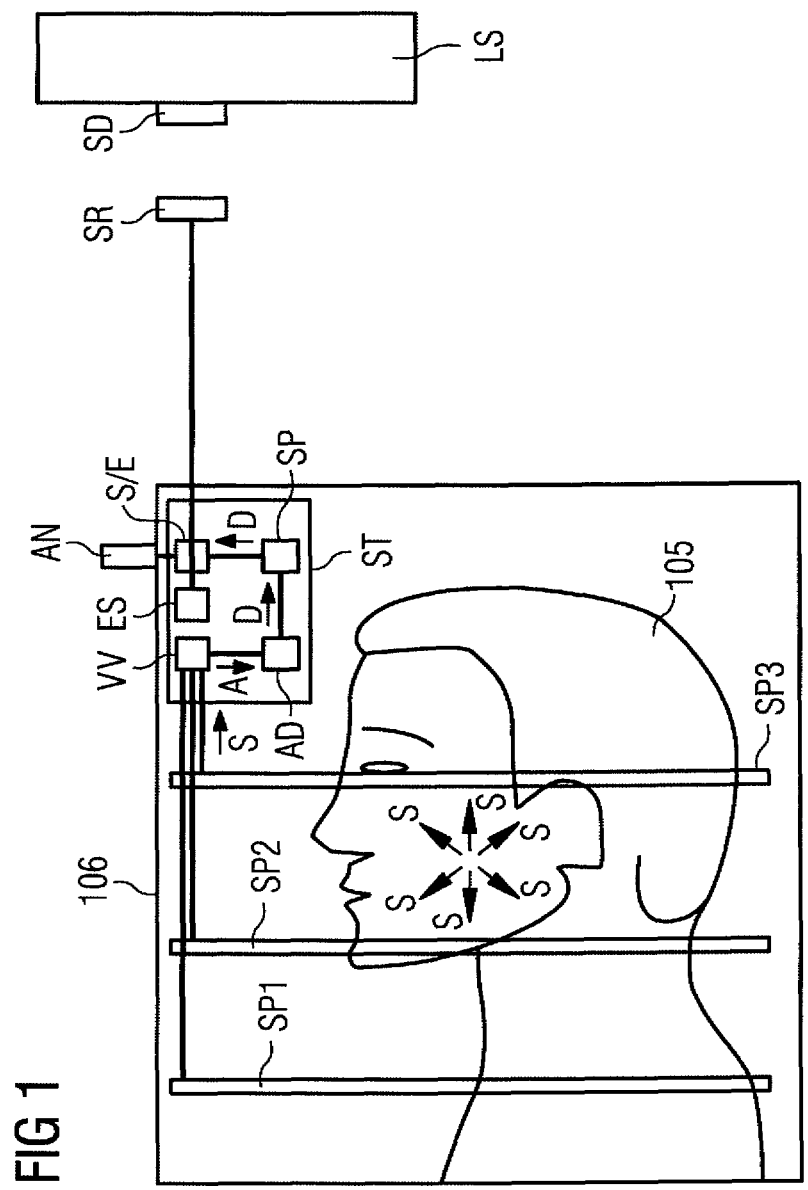
FIG. 1 shows a cross-sectional view of one embodiment of an MRT coil arrangement.

FIG. 1 shows in schematic and simplified outline form, one embodiment of a local coil arrangement 106 for a magnetic resonance tomography system (101), with magnetic resonance tomography (MRT) antenna elements SP1, SP2, SP3 for the reception of MR signals S (e.g., originating from excited nuclei of an object under examination 105). The local coil arrangement 106 includes an A/D converter AD for the conversion of analog MR signals A received with one or more of the MRT antenna elements SP1, SP2, SP3 (e.g., amplified with a preamplifier VV) into digitized signals D. The local coil arrangement 106 also includes a memory SP for the storage of the digitized signals D and an antennae control device S/E for actuation of an antenna AN for the transmission of the stored signals D (e.g., at a desired point in time) to the MRT (e.g., elements 167, 101) for processing and/or storage of the digitized signals D at the MRT.

The local coil arrangement 106 (e.g., MR receiver coils) measures large quantities of data in a very short time. In architectures in the prior art, the signals received with a receiver coil are initially amplified, possibly converted to a different frequency and transmitted in analog form, for example, via a cable or by radio, to a receiver located outside the MRT system. The signals received with the receiver coil are digitized and further processed. Shielded high frequency cables, for example, are employed.

Highly integrated AD converters in the form of application specific integrated circuits (ASICs) are known internally and may digitize a signal S received with an MR receiver coil 106 locally. Methods for digital wireless data transmission with the "Bluetooth" standard in the MR system are also known. The methods for digital wireless data transmission are, for example, used for the transmission of EKG signals.

According to one embodiment, a data store SP is provided in the local coil arrangement 106. Received, digitized measurement data (e.g., signals S) may be buffered in the data store SP. The storage may, for example, encompass data D received over several seconds or minutes, or during a pulse train or an entire imaging examination.

In the measurement process (e.g., on receiving signals S transmitted by excited nuclei of the object under examination 105 in the FoV), the data S is digitized in real time and initially written into this memory SP in digitized form (D).

A transmitter unit S/E transmits the data D from the memory SP to a unit 167, 119 of the MRT, if possible and/or desired. In one embodiment, the memory SP is realized with an A/D converter AD and further modules (S/E, ST) together in an ASIC.

In one embodiment, the local coil arrangement 106 transmits preamplified, digitized measurement data D via a connection AN-167 (e.g., radio), the bandwidth of which may at times be lower than the data rate, with which the data S is measured (e.g., received from the coils SP1, SP2, SP3 and digitized). The transmission takes place, for example, during the MRT measurement (e.g., during the reception of signals S from the object under examination 105), so that the entire data D is, for example, transmitted in complete form at the end of the examination or shortly after the end of the examination, and only short-term (data quantity) peaks of the data D in the memory SP are buffered. In this configuration, the memory SP may be selected to be relatively small (e.g., <20% of the data quantity D accruing in total during the examination). The data rate of the connection (AN-167) cannot orient itself to a maximum (of the amount of data to be transmitted), which may seldom occur. Instead, the data rate of the connection orients itself to an average (of the amount of data to be transmitted).

In another embodiment, the connection (AN-167) is available only at certain times (in sufficiently good condition). For example, the connection may only be available in the case of inactivity of the HF system of the MRT system 101. The data is buffered (SP) and transmitted (S/E), if the data link (AN-167) is possible, for example, for as long as the patient 105 is located in the device 101 (or the FoV). In this example, the memory SP may be comparatively larger (e.g., >20%-<100% of the data D to be transmitted in the case of an MRT examination of the object under examination), in order to exclude the possibility of "overflow" of the memory. Interference between the MRT system 101 (e.g., HF and/or gradient coils) and the data transmission (AN-167) may be compensated by transmit pauses in the data transmission (A-167), and the transmission system may be configured in simple form.

In one embodiment, the transmission takes place only if the patient 105 and the local coil arrangement 106 are no longer in the MRT system 101, 103 or the FoV. The MRT measurement (imaging MRT scan of the patient) proceeds such that the local coil arrangement 106 (removed from the patient 105 and), for example, is hooked up (e.g., with a plug connector SR and a socket SD) to a charging station LS (e.g., rechargeable) in order to recharge an energy store ES (e.g., rechargeable battery) and at the same time to read out data stored in the memory SP. This reading-out process may take place wirelessly (e.g., using Bluetooth or other devices) over a very short distance or in wired form (e.g., via a coaxial cable), with realization of the transmission being simple. The memory SP may be capable of storing the complete data D accruing during the imaging MRT scan of the object under examination 105.

In one embodiment, the memory SP is configured as a portable data medium that, after the end of the imaging MRT scan of the object under examination 105, is removed from the local coil arrangement 106 and inserted into a computer at a later point in time (e.g., in the same or similar manner to a USB memory stick or a memory card as is, for example, familiar from a digital camera).

In order to enable rapid feedback or decision-making about the success of the imaging, a whole body coil built into the system may be operating in parallel at the same time as the reception and recording SP of the (high-value) local coil data S, D, in order to generate preview images of the object under examination 105 with lower quality (than images of the local coil).

The memory SP is used for the depositing of supplementary information or background information (e.g., in addition to the data D created for imaging) for imaging examination, for example, relating to the protocols selected for the imaging MRT scan or settings on the MRT (e.g. pulse trains). The examination is, for example, planned while the patient 105 is outside the MRT, the local coil arrangement 106 positioned and the protocol and/or parameters of the planned MRT examination are stored on the local coil arrangements 106 in the memory SP. The patient 105 is conveyed to the MRT system 101, where the protocol is transferred from the memory SP of the local coil arrangement 106 to the MRT system 101, 110 and executed (as imaging MRT measurement with the patient 105).

In one embodiment, the transmission takes place, for example, via a wireless or wired connection A-167 that is secured using blockwise checksums. If after the transmission of a data block, the receiver system 168/117 establishes that the data block is faulty, the data block is transferred afresh from the memory SP of the local coil arrangement 106 to the MRT system 167.

In one embodiment, a local data storage SP of data D on an MRT local receiver coil arrangement 106 is provided.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil arrangement configured for a magnetic resonance tomography system, the local coil arrangement comprising:
   an antenna element configured for reception of signals from an object under examination;
   an A/D converter configured for conversion of analog signals received with the antenna element into digitized signals before transmission to a receiver outside of the local coil arrangement, the A/D converter being positioned locally within the local coil arrangement;
   a memory configured for the storage of the digitized signals;
   a device configured for one or more transmissions of the digitized signals stored in the memory, the device comprising a USB connection configured for cable-based transmission of the digitized signals that have been stored in the memory.

2. The local coil arrangement as claimed in claim 1, wherein the device that is configured for the transmission of the stored digitized signals further comprises an antenna operable to transmit the stored digitized signals.

3. The local coil arrangement as claimed in claim 2, further comprising:
   an antenna control device configured for actuation of the antenna operable to transmit the stored digitized signals, wherein the antenna control device comprises a transmission amplifier configured for amplification of the stored digitized signals to be transmitted.

4. The local coil arrangement as claimed in claim 1, further comprising:
   a housing that supports the antenna element, the A/D converter, the memory, and the device, wherein the antenna element, the A/D converter, and the memory are each disposed inside the housing.

5. The local coil arrangement as claimed in claim 4, wherein the local coil arrangement is positionable, on or around, a portion of a patient undergoing magnetic resonance imaging.

6. The local coil arrangement as claimed in claim 1, further comprising a preamplifier configured for amplification of MRT signals that are received prior to the A/D conversion.

7. The local coil arrangement as claimed in claim 1, further comprising a controller configured to consecutively transmit a plurality of the stored digitized signals stored in the memory.

8. The local coil arrangement as claimed in claim 1, wherein the A/D converter comprises an application specific integrated circuit (ASIC).

9. The local coil arrangement as claimed in claim 1, wherein at least the memory and the AD converter, are realized together in an application specific integrated circuit (ASIC).

10. The local coil arrangement as claimed in claim 1, wherein the local coil arrangement is configured such that upon imaging scanning of the object under examination, the signals are digitized in real time and are initially written to the memory.

11. The local coil arrangement as claimed in claim 10, further comprising a controller configured so that the digitized signals stored in the memory are transmitted during or after a measurement process.

12. The local coil arrangement as claimed in claim 10, further comprising a controller configured so that measurement data stored in the memory is transmitted via a connection having a bandwidth at least at times lower than a signal data rate, with which the analog signals are received from the object under examination.

13. The local coil arrangement as claimed in claim 10, further comprising a controller configured so that transmission of the measurement data from the local coil arrangement takes place during the reception of magnetic resonance tomography (MRT) signals, and that only at particular times are data quantity peaks within data buffered through storage in the memory.

14. The local coil arrangement as claimed in claim 1, wherein a size of the memory is sufficient for and the memory is configured to store more than 80% of the signals accruing in an imaging scan of the object under examination.

15. The local coil arrangement as claimed in claim 1, wherein a size of the memory is sufficient for and the memory is configured to store all data accruing in an imaging scan of the object under examination.

16. The local coil arrangement as claimed in claim 1, further comprising a controller configured so that during an imaging scan of the object under examination, signals accruing are stored and transmitted only after an imaging scan of the object under examination by radio frequency or in a wired/USB cable connection manner.

17. The local coil arrangement as claimed in claim 1, wherein the local coil arrangement is configured such that transmission of the stored signal only takes place when the object under examination, the local coil arrangement, or the object under examination and the local coil arrangement are no longer located in a field of view (FoV).

18. The local coil arrangement as claimed in claim 1, further comprising a device configured for my one connection of the local coil arrangement to a charging station in order to replenish an energy store of the local coil arrangement and configured at the same time, to read out the digitized signals stored in the memory.

19. The local coil arrangement as claimed in claim 1, wherein the memory is configured as a data medium that is removable from the local coil arrangement.

20. The local coil arrangement as claimed in claim 1,
   wherein the local coil arrangement is configured such that imaging information is also deposited in the memory, and
   wherein the imaging information comprises imaging information relating to protocols selected in order to perform the imaging, details of an imaging examination, or the protocols selected in order to perform the imaging and the details of the imaging examination.

21. The local coil arrangement as claimed in claim 1,
wherein the local coil arrangement is configured such that during transmission of stored signals, block-wise checksums are used in security purposes, and
wherein in the case of a faulty block of data within the stored signals, the faulty block of data is once more transferred from the memory.

22. The local coil arrangement as claimed in claim 1,
wherein the local coil arrangement is a magnetic resonance tomography local coil arrangement, and
wherein the antenna element is a magnetic resonance tomography antenna element.

23. The local coil arrangement as claimed in claim 2, wherein the device configured for the transmission of the stored digitized signals further comprises a Bluetooth antenna.

24. The local coil arrangement as claimed in claim 1, wherein the device configured for the transmission of the stored digitized signals further comprises a coaxial cable connection.

25. A method of storing signals in a local coil arrangement of a magnetic resonance tomography system, the method comprising:

receiving, with an antenna element, signals transmitted from an object under examination;

converting, with at least one A/D converter of the local coil arrangement, analog signals received with the antenna element into digitized signals before transmission to a receiver outside of the local coil arrangement, the A/D converter being positioned locally within the local coil arrangement;

storing the digitized signals in a memory located within the local coil arrangement; and transmitting, with a device comprising a USB connection configured for one or more cable-based transmission of the digitized signals, the digitized signals stored in the memory.

* * * * *